United States Patent

Asplund et al.

[11] Patent Number: 6,151,201
[45] Date of Patent: Nov. 21, 2000

[54] GAS-INSULATED HIGH-VOLTAGE SEMICONDUCTOR VALVE MEANS

[75] Inventors: Gunnar Asplund; Olle Ekwall; Olaf Saksvik, all of Ludvika, Sweden

[73] Assignee: ABB AB, Vasteras, Sweden

[21] Appl. No.: 09/125,766

[22] PCT Filed: Mar. 24, 1997

[86] PCT No.: PCT/SE97/00495

§ 371 Date: Oct. 27, 1998

§ 102(e) Date: Oct. 27, 1998

[87] PCT Pub. No.: WO97/36363

PCT Pub. Date: Oct. 2, 1997

[30] Foreign Application Priority Data

Mar. 28, 1996 [SE] Sweden ................................. 9601191

[51] Int. Cl.⁷ ........................................................ H02H 1/00
[52] U.S. Cl. ........................................... 361/117; 361/127
[58] Field of Search ........................................ 361/117, 118, 361/126, 127, 131, 132; 174/140 R, 140 H, 141 R, 144, DIG. 31

[56] References Cited

U.S. PATENT DOCUMENTS

| | | | |
|---|---|---|---|
| 3,603,721 | 9/1971 | Foti et al. | 174/141 R |
| 3,609,218 | 9/1971 | Herb et al. | 174/141 |
| 4,107,455 | 8/1978 | Richards | 174/140 R |
| 4,774,385 | 9/1988 | Toshima | 174/142 |
| 5,371,651 | 12/1994 | Asplund et al. | 361/689 |

FOREIGN PATENT DOCUMENTS

| | | | |
|---|---|---|---|
| WO 93/17488 | 9/1993 | WIPO | H02M 1/002 |
| WO 95/28030 | 10/1995 | WIPO | H02M 1/00 |

*Primary Examiner*—Ronald W. Leja
*Attorney, Agent, or Firm*—Pollock, Vande Sande & Amernick

[57] ABSTRACT

A gas-insulated semiconductor valve for high voltage power has an elongated valve stack with a plurality of semiconductor elements. The valve stack is provided with electrostatic shields for reducing the stresses on the insulating medium. The shields comprise a plurality of annular shields distributed along the longitudinal axis of the valve stack. The shields are arranged in planes which are substantially perpendicular to the longitudinal axis of the stack and surround the valve stack. The curved part of each shield has a substantially constant radius of curvature.

17 Claims, 8 Drawing Sheets

6,151,201

GAS-INSULATED HIGH-VOLTAGE SEMICONDUCTOR VALVE MEANS

TECHNICAL FIELD

The present invention relates to a gas-insulated semiconductor valve means for high voltage and for high power, which comprises a stack of valves with a plurality of semiconductor elements electrically series-connected between a first and a second electrical main connection. The valve stack has a longitudinal axis and the main connections are arranged at opposite ends of the longitudinal axis of the stack. The valve stack is provided with electrostatic shields for reducing the stresses on the insulating gas.

The concept "high voltage" as used in this application relates to a valve voltage exceeding about 50 kV, and the concept "high power" relates to a rated power exceeding about 100 MW in a twelve-pulse converter with valves according to the present invention.

The concept "main connection" as used in this application means a connection to a valve which is intended to carry the load current of the valve, this to distinguish from other electrical connections to the valve which may be arranged for, for example, control and measurement purposes.

BACKGROUND OF THE INVENTION

Semiconductor valves of the kind mentioned in the introduction are previously well-known. The semiconductor elements may consist of thyristors or other controllable semiconductor elements, or of diodes. Such valves are used within electric power engineering in power transmission plants. An important field of use is as valves in converters in installations high voltage power transmission. Another field of use of the valves is as control and switching means in equipment for series- or parallel compensation in ac networks.

Installations of the kind referred to here often have very high operating voltages. The valve voltages often lie at one or a few hundred kV, and the operating voltages relative to ground may be in the interval 500–1000 kV. A result of this is that large insulation distances are required, and the valve and the equipment have large dimensions and require large space.

The above-mentioned disadvantages are especially prominent in the case of enclosed, gas-insulated valves designed for outdoor erection. From, for example, the International Patent Applications WO 93/17488 and WO 95/28030, such valves are known. Each valve (possibly half a valve or two series-connected half valves) is arranged in a separate enclosure. The valve is gas-insulated, and the housing in which the valve itself is arranged is filled with a suitable gas, for example air, nitrogen, or $SF_6$ (sulphur hexafluoride).

Valves of the above-mentioned kind have considerable advantages. The enclosures with the semiconductor valves mounted therein may, in principle, be prepared completely at the factory, and the need of the large valve halls is completely eliminated. However, in case of valves for higher voltages, the completion of the valves at the factory entails relatively large transport dimensions. At the highest currently occurring voltages, the dimensions of the enclosures would be so large that they could not be accommodated within conventional loading-gauges and thus could not be transported at all. The large dimensions of the enclosures would also entail a relatively large need of ground area for erection of the valves, usually 12 or 24 valves, which are included in a single-pole and a two-pole HVDC converter station, respectively.

SUMMARY OF THE INVENTION

The invention aims to provide a semiconductor valve means of the kind described in the introductory part of the description, which has considerably smaller dimensions than prior art semiconductor valves and which thus requires less ground area or hall space for their erection.

The invention preferably aims to provide an enclosed semiconductor valve for outdoor erection, the dimensions of which, also at the highest voltages occurring, will not be so large as to prevent transportation thereof by conventional means of transport.

In a means according to the invention, a plurality of electrostatic shields are arranged one after another along the stack of valves. Each shield is annular and surrounds the stack of valves. The shields are preferably in the form of profiles curved as a circular arc with a constant radius of curvature. The potentials of the shields are controlled so as to approximately follow the potential of adjacent parts of the valve stack. This makes possible considerably shorter insulation distances between the valve stack and adjacent objects than what has been possible so far.

In a preferred embodiment, the valve means is enclosed, one end of the valve stack being positioned at or near the potential of the enclosure and the other end thereof being connected to a bushing. Both the valve stack and the bushing are surrounded by shields, the potentials of which are controlled so that the voltage between the shields and the housing is greatest at the connection of the valve stack to the bushing and decreases in both directions. It has been found that in this way such a considerable reduction of the dimensions of the valve means can be obtained that, also at the highest voltages occurring, the valves means may be completed at the factory and be transported as finished units to the sites of erection.

In an embodiment which, from a mechanical and an electrical point of view, is particularly simple and advantageous, both the valve stack and the bushing are horizontal and arranged one after another in the longitudinal direction of the elongated housing.

BRIEF DESCRIPTION OF THE DRAWINGS

The invention will be described in more detail in the following with reference to the accompanying drawings, wherein.

DETAILED DESCRIPTION OF THE PREFERRED EMBODIMENTS

Figure 1:
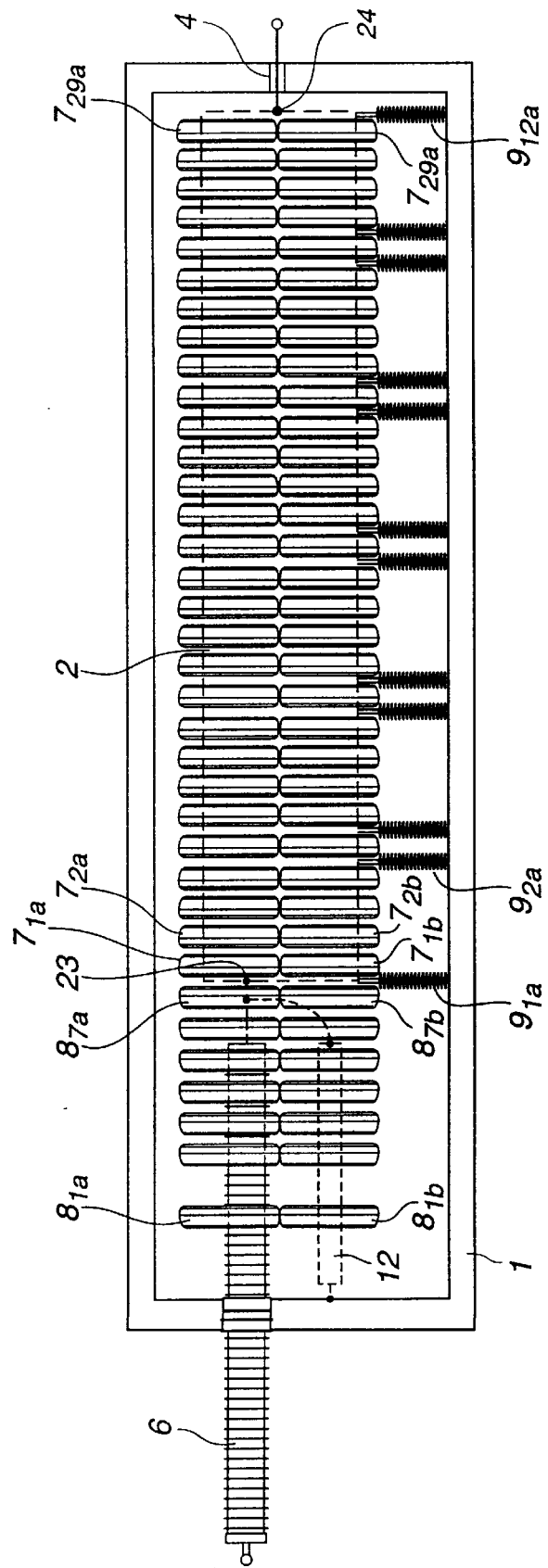
FIG. 1 shows a longitudinal section through a valve means according to the invention.

FIG. 1 shows a longitudinal section through a valve means according to the invention, that is, the longitudinal axis of the valve stack lies in the plane of the paper and is horizontal in the figure. The valve means is intended for outdoor erection with the orientation shown in the figure, that is, with the longitudinal axis of the valve stack substantially horizontal. Of the valve means, the figure shows only the housing 1 and the valve stack 2 (in dashed lines) with their bushings and electrostatic shields.

The housing 1 comprises a metal housing adapted for outdoor erection, which in a known manner is provided with means (not shown) for, for example, ventilation, pressure-maintenance, temperature control and for cooling of the valve stack as well as for communication with the valve stack in the form of control, measurement and monitoring signals. In the example shown the housing is filled with air of atmospheric pressure, and the air constitutes the insulation medium which takes up the voltage between the housing and the valve stack. The housing may be at ground potential or, which is often the case in, for example, converter valves, at a potential which deviates from ground potential from the points of view of both direct and alternating voltage.

The valve stack 2 is schematically shown in the figure in dashed lines. At its two ends, defined by the longitudinal axis, it has its main connections 23 and 24. Between these connections, a plurality of semiconductor elements, for example 50–250, are connected in series, and these elements may, for example, consist of thyristors. In a known manner, the valve stack comprises means for mounting, for cooling and for protection of the elements against, for example, over-voltages, as well as voltage dividers and control, measurement and monitoring circuits. The valve stack is supported by support insulators, arranged on the floor of the housing 1, of which the insulators $9_{1a}$–$9_{12a}$ are shown in the figure.

The main connection 24 of the valve stack lies at a potential which, in principle, is the same as the potential of the housing 1. However, via a bushing 4 for low voltage, the connection is passed through the wall of the housing. A surge arrester for low voltage may be arranged between the housing and the connection 24 to ensure that the connection does not deviate from the potential of the housing by more than a limited absolute value. The main connection 23 of the valve stack is passed, via a high-voltage bushing 6, through the housing wall. A surge arrester 12 shown in dashed lines is arranged between the connection 23 and the housing 1.

According to the invention, a number of identical annular electrostatic shields $7_1$–$7_{29}$ are arranged along the valve stack. Each shield lies in a plane which is perpendicular to the longitudinal axis of the stack, and the shield surrounds the stack. Each shield, for example $7_1$, comprises an upper part, $7_{1a}$, and an lower part, $7_{1b}$.

In the same way, a number of identical shields $8_1$–$8_8$ are arranged along the bushing 6. These shields are identical with the shields of the valve stack and, like these, are arranged in planes which are perpendicular to the longitudinal axis of the stack. These shields surround both that part of the bushing 6 which is situated inside the housing 1 and the surge arrester 12.

Figure 2:
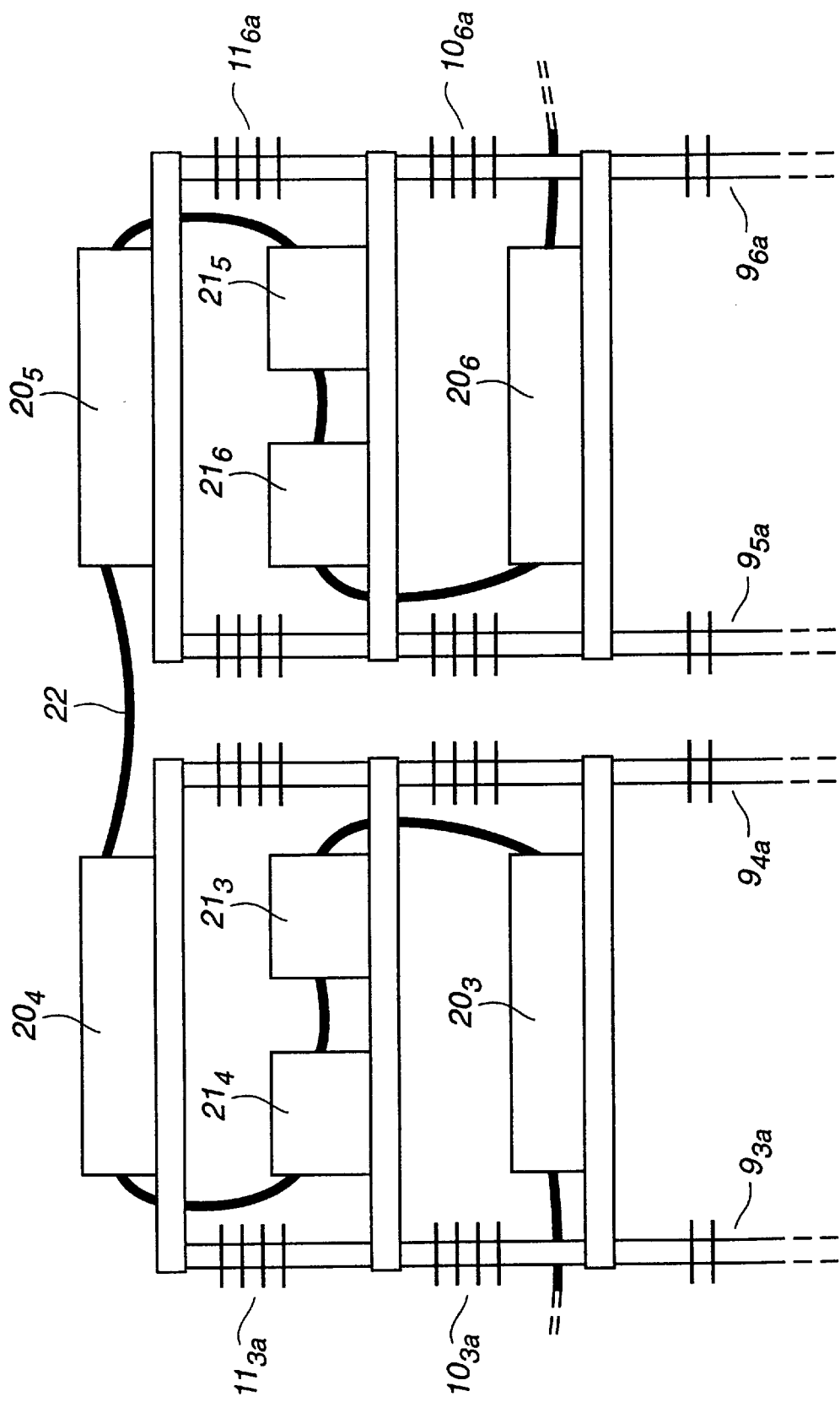
FIG. 2 shows an example of the embodiment of the valve stack itself in the means according to FIG. 1.

FIG. 2 shows two of the six sections of the valve stack. Each of these is supported by four support insulators, of which the insulators $9_{3a}$, $9_{4a}$, $9_{5a}$ and $9_{6a}$ are shown. Each section comprises two thyristor modules, $20_3$, $20_4$, $20_5$ and $20_6$, and two reactors, $21_3$, $21_4$, $21_5$ and $21_6$. The reactor modules and the upper thyristor modules are supported by support insulators, of which the insulators $10_{3a}$–$10_{6a}$ and $11_{3a}$–$11_{6a}$ are shown. The electrical series connection of the thyristor modules and the reactors is made in the way shown in the figure by means of connection conductors, for example 22, schematically shown in thick lines.

Figure 3:
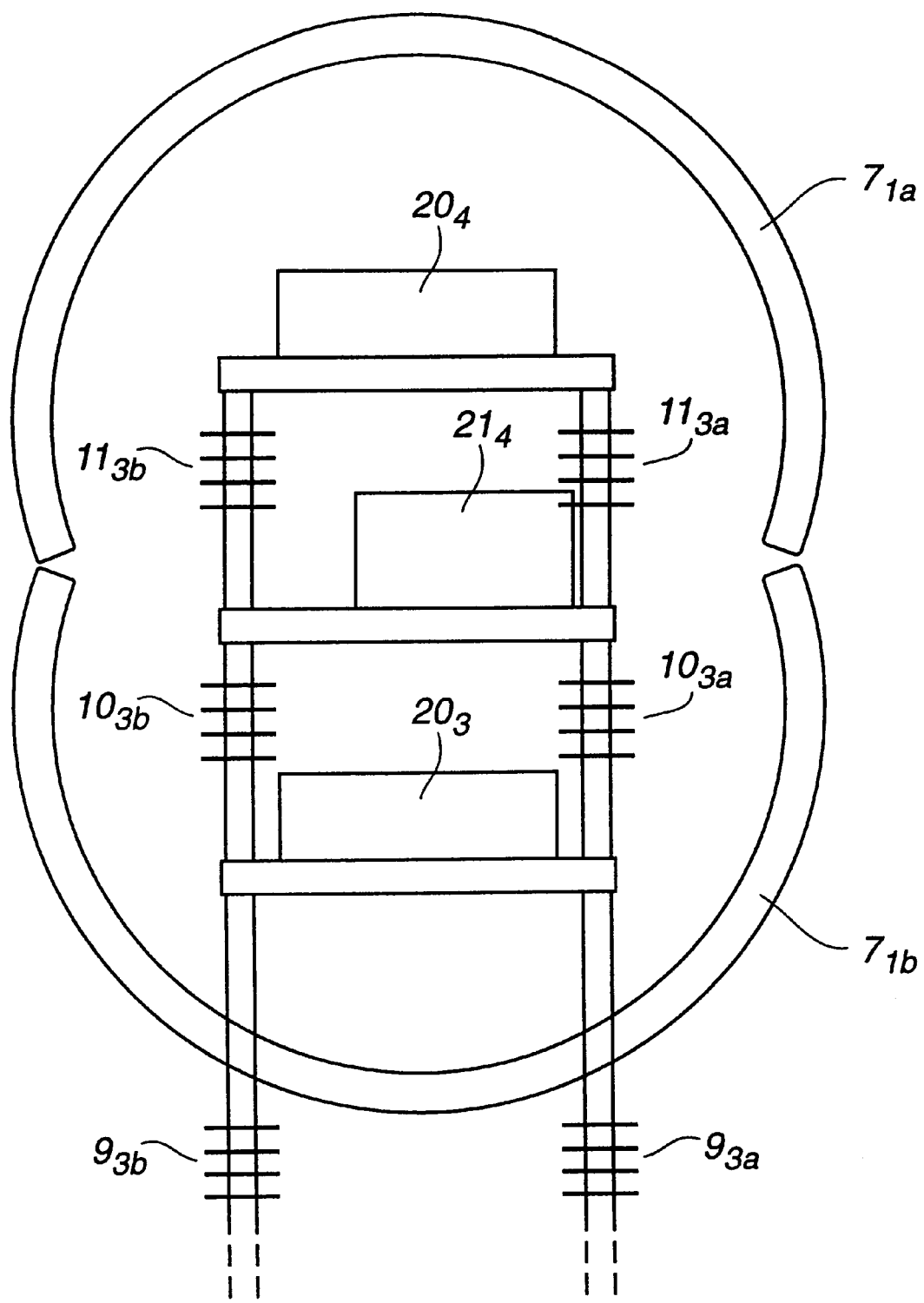
FIG. 3 shows a cross section through the means according to FIG. 1.

FIG. 3 shows, viewed from the left in FIG. 2, the valve stack section which has the thyristor modules $20_3$ and $20_4$. The figure shows the thyristor modules, supported by the support insulators $9_{3a}$, $9_{3b}$, $10_{3a}$, $10_{3b}$, $11_{3a}$, $11_{3b}$, and the reactor $21_4$. The figure also shows one of the shields surrounding the valve stack, namely, the shield $7_1$ consisting of the two identical parts $7_{1a}$ and $7_{1b}$. Each shield part comprises a light-metal profile which is curved so as to form a circular arc with a center angle which is somewhat large than 180°. The other shields of the valve stack are identical with that shown in FIG. 3.

Since each shield comprises two parts, the shield can be mounted and dismantled independently of the other shields, which is a significant advantage both during the manufacture and during the supervision work on the valve stack. Since each shield part forms a circular arc, the center angle of which exceeds 180°, the joints or the transitions between the two shield halves are somewhat retracted towards the valve stack. In this way, the external field strength is reduced at these portions, which increases the electrical strength of the means. The shields can suitably be mounted to the valve stack by means of suitable metallic or electrically insulating rod or other means of attachment (see further below with reference to FIG. 5).

Figure 4:
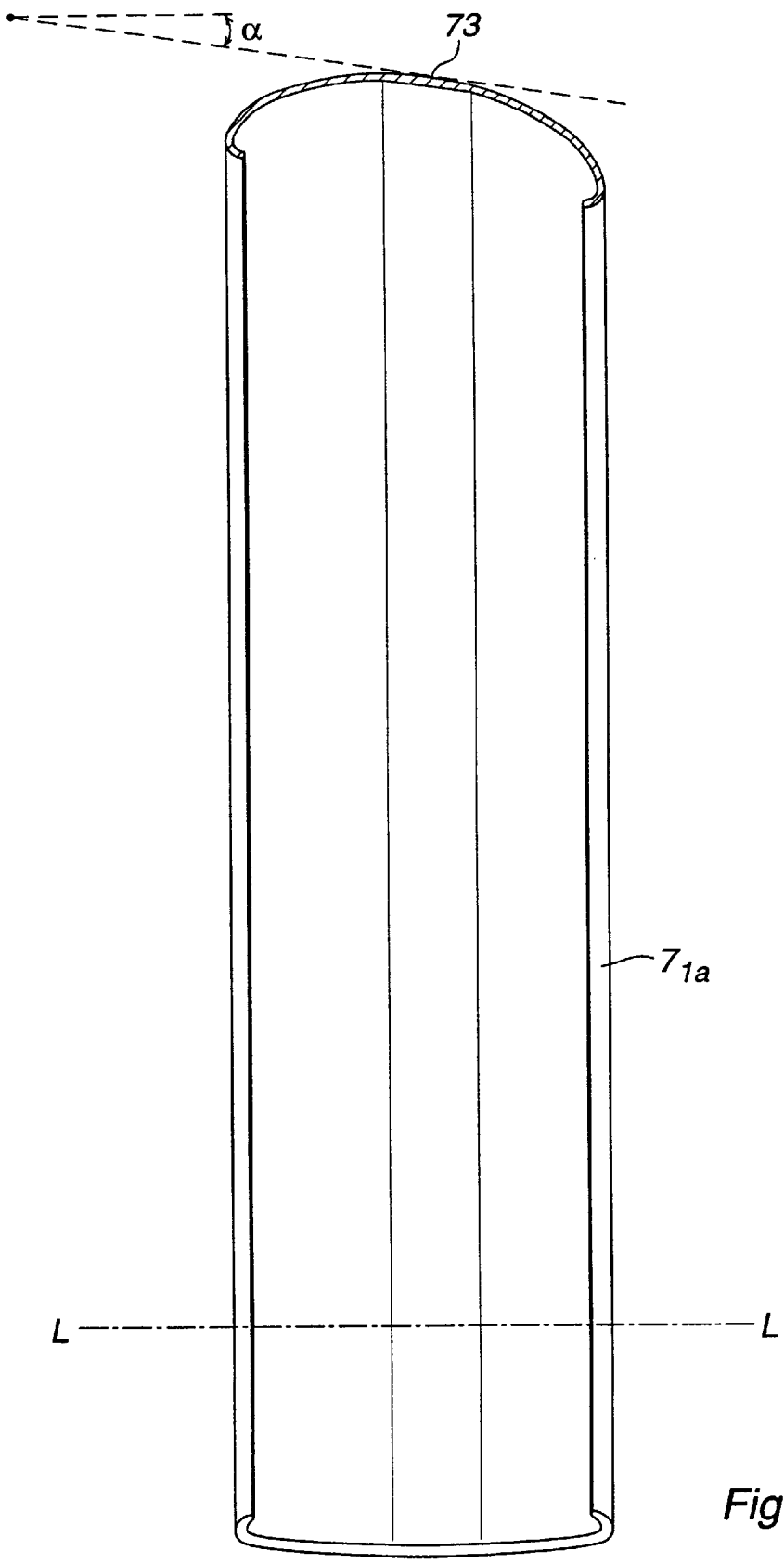
FIG. 4 shows in more detail the embodiment of one of the shields of the means.

FIG. 4 shows a vertical section through the longitudinal axis of the valve stack through the upper shield part $7_{1a}$. The shield is made from a symmetrical light-metal profile with a smoothly rounded cross section. In the embodiment shown here, its external envelope surface 73 forms an angle α with the direction L—L of the longitudinal axis of the stack. The angle α may, for example, be about 10°, and the inclination is such that the distance of the envelope surface from the valve stack decreases from left to right in FIG. 1, that is, from that end of the stack which has the highest voltage relative to the housing 1 to that end which has the lowest voltage relative to the housing. All the shields $7_1$–$7_{29}$ are made in this way. In this way, the envelope surfaces of the shields will follow the electrical equipotential surfaces more closely, which contributes to reduce the field strength outside the shield.

Figure 5A:
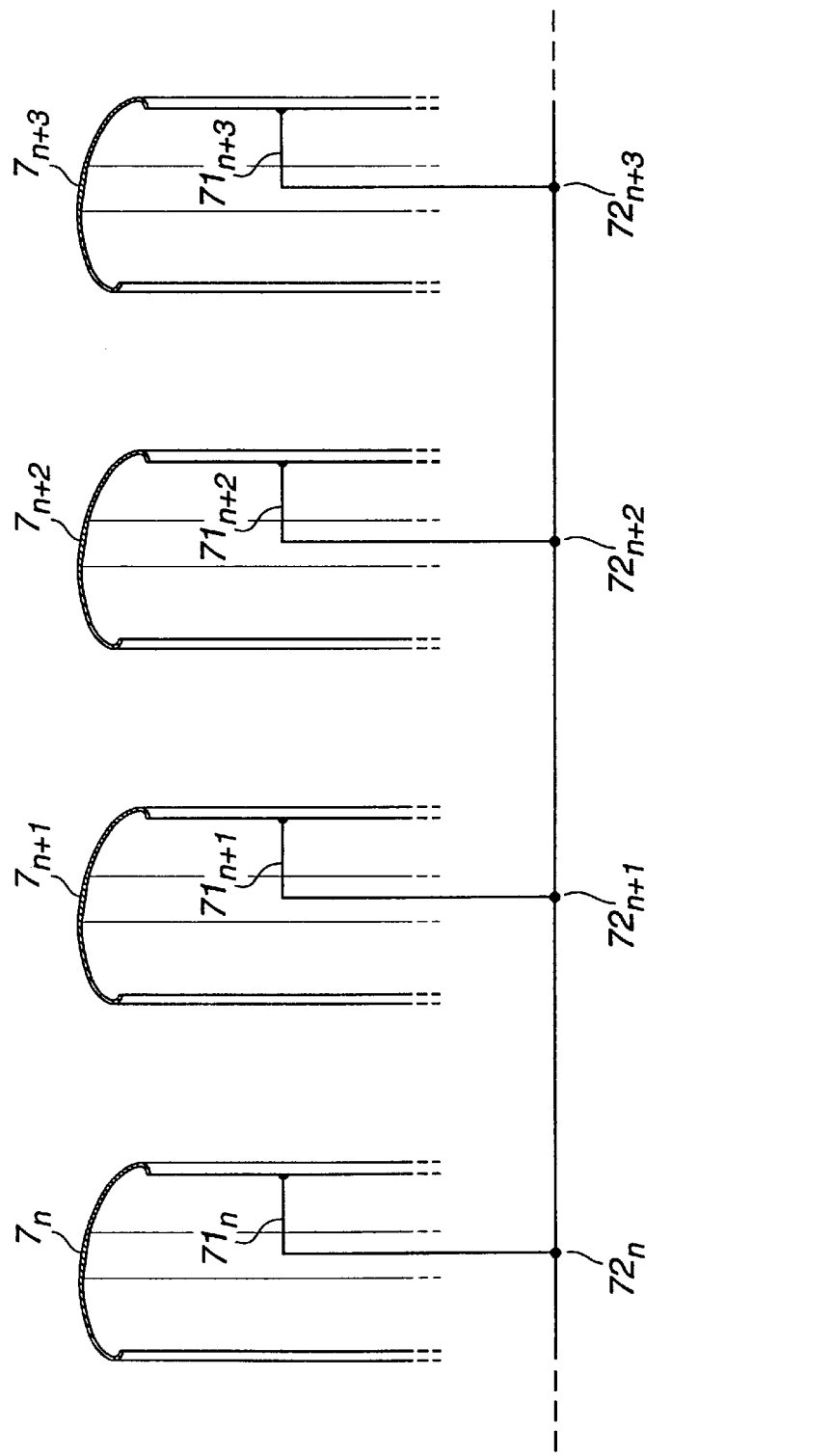
FIG. 5a shows how the potential control of the shields can be obtained by connecting the shields to suitable points on the valve stack.

FIG. 5 shows two alternative ways of controlling the potentials of the shields 7. Their potentials are controlled so that they approximately follow the potential of the valve stack, that is, so that they have the highest voltage relative to the housing at the main connection 23 of the valve stack and that their voltage decreases along the valve stack in a direction towards the second main connection 24 thereof. FIG. 5a shows how some shields $7_n$, $7_{n+1}$, $7_{n+2}$, $7_{n+3}$ with the aid of electrically conducting means $71_n$, $71_{n+1}$, $71_{n+2}$, $71_{n+3}$ are connected to schematically shown connection points $72_n$, $72_{n+1}$, $72_{n+2}$, $72_{n+3}$ on the valve stack. This consists of a relatively large number of series-connected semiconductor elements, and all of these are normally accessible to electrical connection. It is therefore possible to choose suitable connection points for the different shields so that the desired potential distribution is obtained, for example a potential which decreases linearly along the stack from the shield $7_1$ to the shield $7_{29}$, which has a low voltage relative to housing.

The chosen connection points thus need not, as in the figure, be positioned right in front of the shields but may be displaced to a certain extent relative thereto in one or the other direction in the longitudinal direction of the stack.

The electrically conducting means $71_n$ etc. may consist of electrically conducting mounting rods or similar means, by means of which the shields are fixed to the valve stack. Alternatively, of course, the shields may be mounted to the valve stack with the aid of electrically insulating mounting means, in which case separate conductors are used for connection of the shields to their connection points on the valve stack.

Figure 5B:
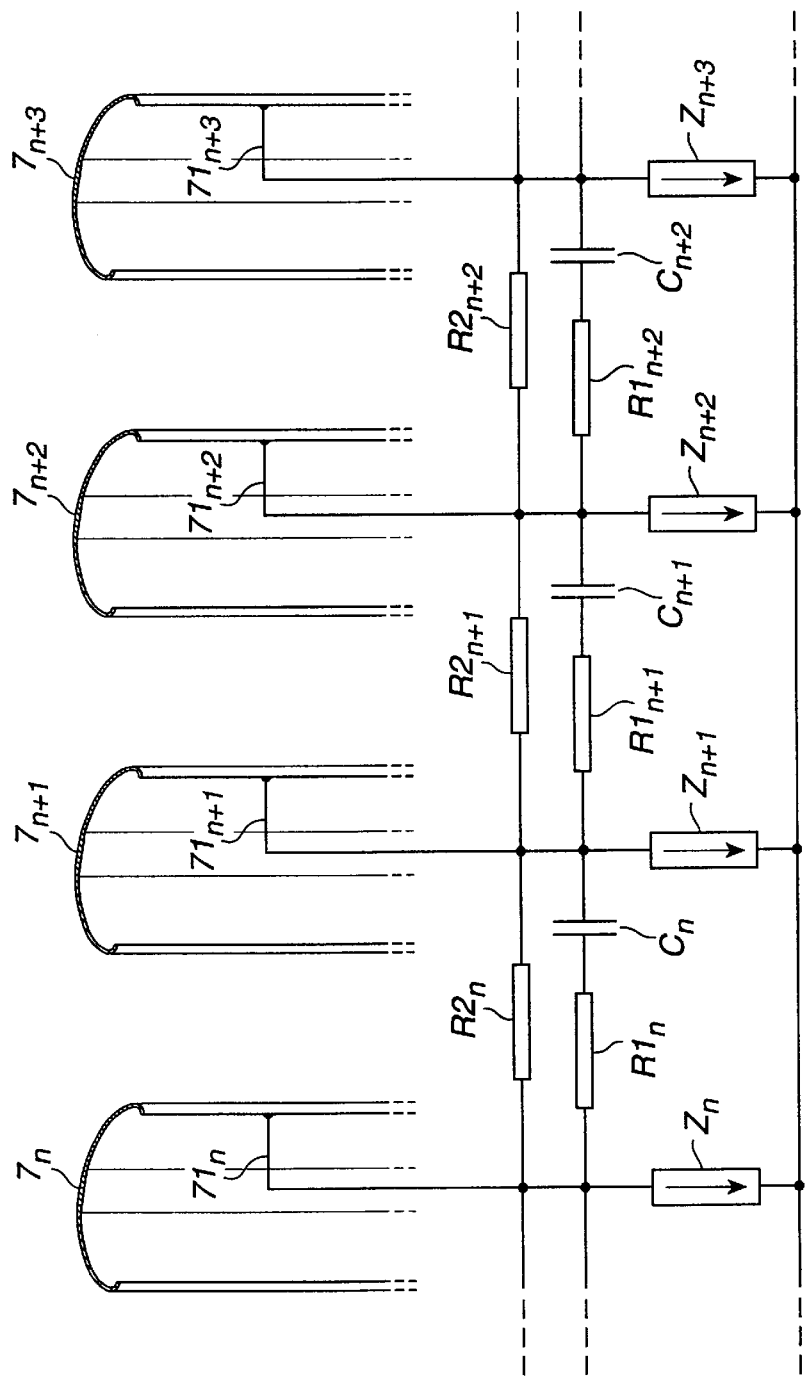
FIG. 5b shows how, according to an alternative embodiment, a separate voltage divider can be arranged for potential control of the shields.

FIG. 5b shows how a separate voltage divider can be used for control of the potentials of the shields. The voltage divider is connected between the two main connections 23 and 24 of the valve stack and comprises a number of sections, each one with one connection point for each shield. Each section has one resistive-capacitive branch (resistors $R1_n$, $R1_{n+1}$, $R1_{n+2}$ and the capacitors $C_n$, $C_{n+1}$, $C_{n+2}$) for dynamic voltage distribution and one purely resistive branch (resistors $R2_n$, $R2_{n+1}$, $R2_{n+2}$) for static voltage division. The figure shows as an example the three sections of the voltage divider which has the connection points for the shields $7_n$, $7_{n+1}$, $7_{n+2}$, $7_{n+3}$. In this case, the connection conductors $71_n$–$71_{n+3}$ of the shields are connected to the voltage divider in the way shown in the figure, and the voltage divider controls the potentials of the shields. Also in this case the desired potential distribution may be obtained by a suitable choice of impedances of the components of the voltage divider sections. In this case the shields are electrically insulated from the valve stack, for example mounted thereto with the aid of electrically insulating mounting means. Further, the embodiment according to FIG. 5b has the advantage that, by a suitable choice of capacitances of the capacitors of the voltage divider sections, stray capacitances between the shields and the housing can be compensated for so that the desired voltage distribution is obtained also in case of rapid transients. For limitation of the voltage between the valve stack and the shields/the voltage divider, arresters $Z_n$, $Z_{n+1}$, $Z_{n+2}$, $Z_{n+3}$ are arranged between the voltage divider and the valve stack, whereby the risk of electrical flashovers, arising under certain abnormal operating conditions, is eliminated.

Alternatively, the resistors $R2_n$, $R2_{n+1}$, $R2_{n+2}$, etc., can be replaced by or be supplemented with metal-oxide varistors, which then also ensure harmless values of the voltages between shields positioned adjacent to each other.

The shields $8_1$–$8_7$ are identical with the shields $7_1$–$7_{29}$. However, they are mounted so that their envelope surfaces incline in opposite directions to the corresponding surfaces of the shields $7_1$–$7_{29}$, that is, the distance of each envelope surface from the valve stack decreases from right to left in FIG. 1. The potentials of the shields are controlled in the same way as the potentials of the shields $7_1$–$7_{29}$, that is, either so that they are connected to suitably located points on the valve stack 12 (in similar manner as that shown in FIG. 5a) or that a separate voltage divider connected between the housing 1 and the connection 23 is arranged for the potential control of the shields (in similar manner as that shown in FIG. 5b).

Figure 6:
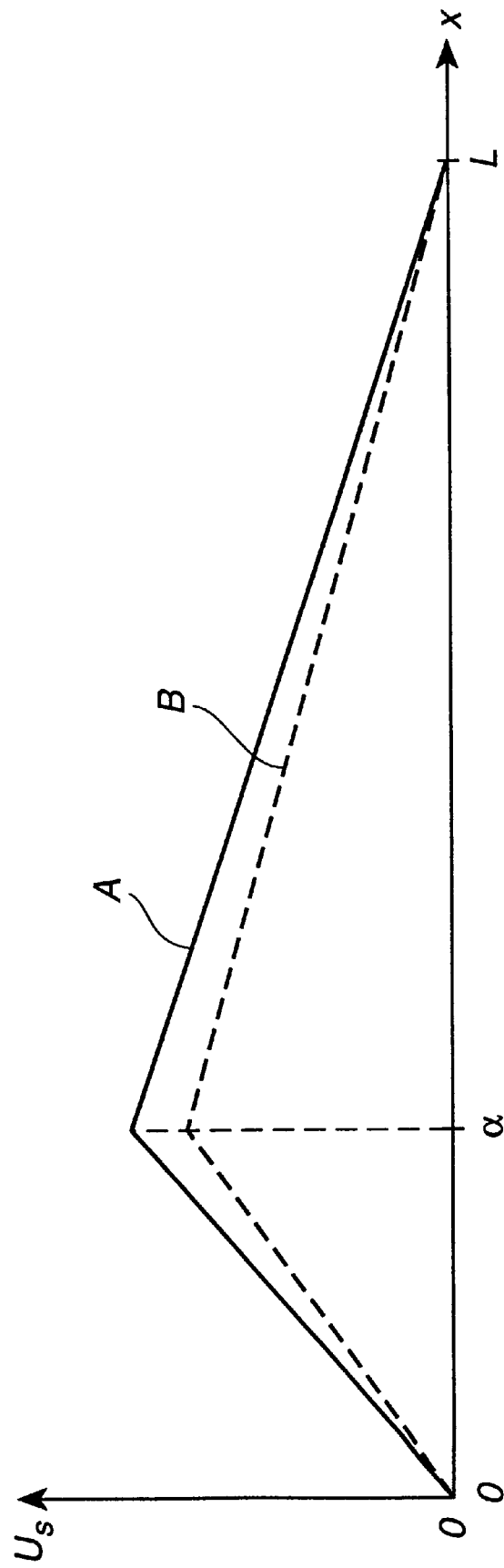
FIG. 6 shows an example of how the potentials of the shields vary with their position along the valve stack and the bushing.

FIG. 6 shows how the potentials of the shields vary with their position along the valve stack and the bushing. The distance of the shields from the lefthand end wall of the housing 1 in FIG. 1 is designated x, that is, at the left-hand end wall of the housing x=0, and at the righthand end wall of the housing x=L, where L is the length of the housing. At the lefthand end of the valve stack, that is, at the main connection 23, x=a. The potentials of the shields are designated $U_s$, the potential of the housing being 0. According to a preferred embodiment, the potentials of the shields are controlled according to the curve designated A, that is, the voltage between the shields and the housing is highest at the lefthand end of the valve stack and decreases approximately linearly towards the two ends of the housing.

In another preferred embodiment, the potentials of the shields are controlled so that a certain minor part, for example about 10%, of the voltage between the housing and a certain point of the valve stack is taken up between the stack and the shield positioned outside this point, whereby the voltage stress between the shields and the housing can be reduced. One example of the potential distribution in this embodiment is shown by the curve designated B.

The two potential distributions shown in FIG. 6 may, of course, be adjusted to a greater or smaller degree depending on the requirements and the circumstances of the particular case, and the most suitable potential distribution in a certain case may, in principle, be determined with the aid of three-dimensional field calculations.

Figure 7:
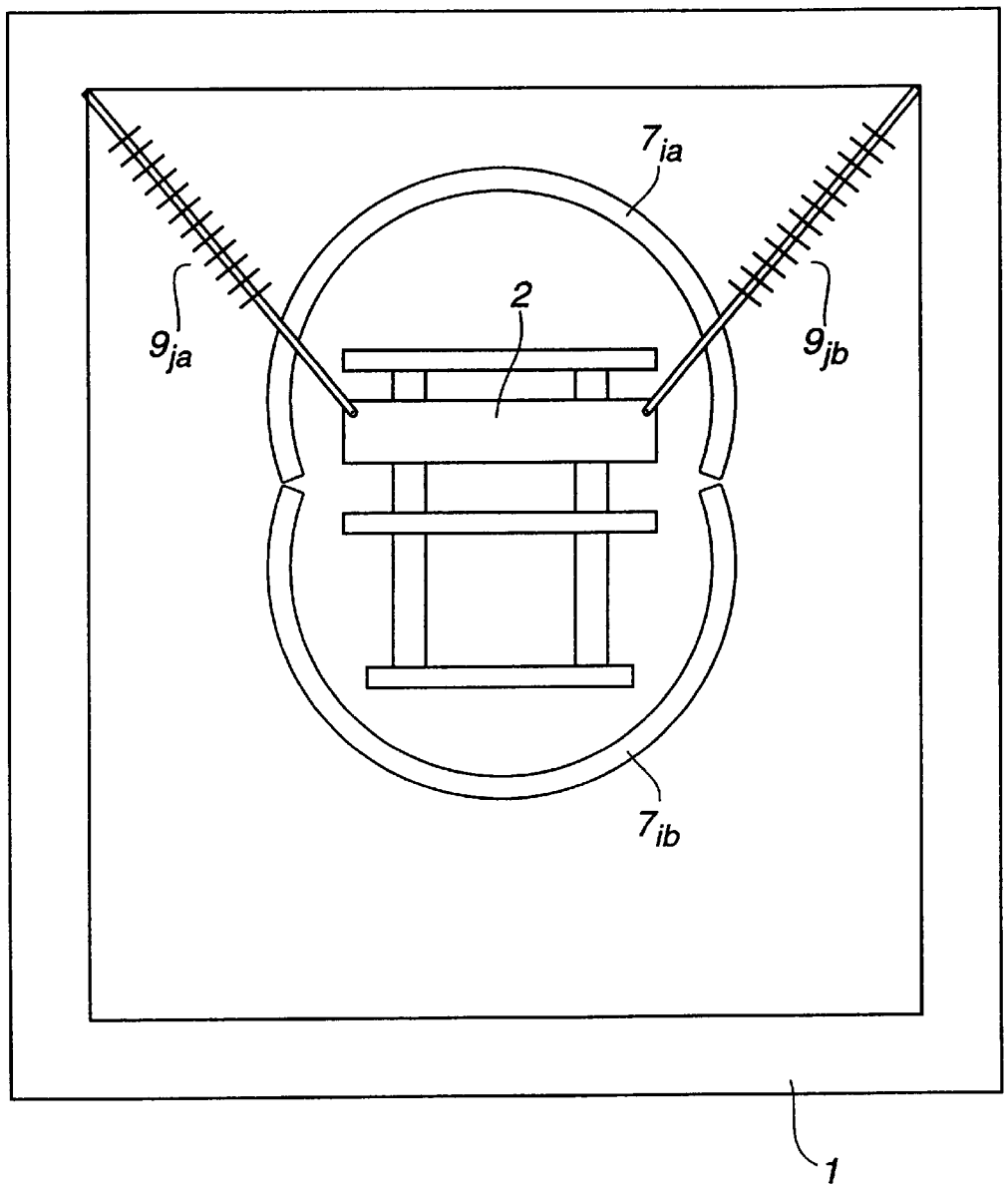
FIG. 7 shows an alternative embodiment in which the valve stack is arranged suspended from its housing.

FIG. 7 shows a cross section through a valve means according to an alternative embodiment of the invention. The schematically shown valve stack 2 with its shields $7_{ia}$ and $7_{ib}$ is here arranged suspended from the housing 1 and is supported by suspension insulators, which are attached to the upper part of the housing 1, and of which the insulators $9_{ja}$ and $9_{jb}$ are shown.

It has proved that the transverse dimensions (width and height) of a valve means according to the invention can be reduced drastically (in a typical case, both width and height were approximately halved) compared with what would have been required in a corresponding prior art valve means. Also at the highest operating voltages occurring, an enclosed outdoor valve according to the invention will therefore have such moderate dimensions that it can be transported without problems from the factory to the site of erection, and, in addition, the need of ground area for an installation with valve means according to the invention will be considerably smaller than for prior art valve means of a corresponding kind. The reduced dimensions also entail a reduction of the weight and cost of a valve means.

In the foregoing, an enclosed valve means designed for outdoor erection is described. The invention can also be applied to a non-enclosed valve designed for outdoor erection, in which case the good utilization by the invention of the insulating properties of the air makes possible a considerably reduced distance between the valves and between these and other apparatus, which results in a smaller volume and lower cost of valve halls.

In the valve means described above, air is used as insulating medium, and the housing is filled with air having atmospheric pressure. Alternatively, other gaseous insulating media may be used, for example nitrogen or $SF_6$, and then possibly at higher pressures than atmospheric pressure.

In the foregoing, a valve means is described which has one single valve in the strict sense of the word. However, the invention can also be applied, with appropriate changes, to valve means which in an enclosure has, for example, one part of a valve, or two valves series-connected to each other, or adjoining parts of two valves.

In the valve means described above, the low-voltage part (the main connection 24) of the valve stack is connected to a bushing. Alternatively, however, this connection can be directly connected to the housing or enclosure of the means.

The embodiment of the electrostatic shields described above is only an example of a preferred embodiment.

The shields described above are made of profiles bent as a circular arc, that is, the radius of curvature is constant and hence within the scope of given external dimensions as large as possible, which gives the least possible stresses on the insulating medium. In order that the advantages of the invention, in the form of reduced dimensions of the valve means, shall be as large as possible, the dimensions of the shields, in a plane perpendicular to the longitudinal axis of the stack, should be as small as possible. This means that the radius of curvature of the shield should be of the same order of magnitude as, and exceed by as small an amount as possible, the transverse dimensions of the valve stack. Another factor which must also be taken into consideration is whether each shield is arranged at approximately the same potential as parts of the valve stack located inside the shield, or whether the shields, in the manner described above, are given such potentials that a certain minor part of the valve voltage is taken up between the stack and the shields.

It is, of course, within the scope of the invention to design the shields with a different shape, for example with a somewhat varying radius of curvature. Also, the profile of the shields may deviate from the symmetrical profile described above with an inclined external envelope surface, and the profile may be unsymmetrical and/or have an external envelope surface which is substantially parallel to the longitudinal axis of the valve stack.

The two-part shields described afford significant advantages during mounting/dismantling, but, alternatively, of course, each shield may be designed in one single part, and for example, have the shape of one single, closed circular arc, or be designed as two semicircular arcs joined by more slightly curved (possibly straight) portions. Further, within the scope of the invention, the shields may be designed in more than two parts. However, the shape described above affords considerable advantages in the form of simple manufacture (all the shields halves are identical with each other), simple mounting/dismantling and a shape which gives least possible electrical stresses on the insulating medium.

In the embodiment described above, the shields are identical and equidistant, but if considered appropriate, the scope of the invention permits the shields to have different widths and/or to be placed at distances from each other which vary along the longitudinal axis of the means, for example with the shields located more spaced from each other nearer the ends of the means, where the voltage stresses are lower.

The methods for control of the potentials of the shields described above may be varied within the scope of the invention. One possible way of controlling the potentials of, for example, the shields located outside the high-voltage bushings (6 in FIG. 1) is to use the cooling water pipes of the valve as voltage divider. The pipes are then provided with electrodes connected to the shields, which electrodes are placed so as to obtain the desired potential distribution of the shields.

What is claimed is:

1. A gas insulated semiconductor valve means for high voltage and for high power, comprising a valve stack with a plurality of semiconductor elements electrically series-connected between a first and a second electrical main connection, and an enclosure, surrounding the valve stack, with an elongated bushing arranged in the wall of the enclosure, the valve stack having a longitudinal axis (A–A) and connections arranged at the opposite ends thereof, a first connection at low potential relative to the enclosure and a second connection connected to the bushing, the valve means having a first set of shields, said set having a plurality of annular electrostatic shields distributed along the longitudinal axis of the valve stack arranged in a plane substantially perpendicular to the longitudinal axis, and surrounding the valve stack, each shield with curved paths, so as to be of annular shape, whereby the curved parts of each shield have a substantially constant radius of curvature whereby the shields in the first set of shields are electrically connected to a first potential-controlling member to control the potentials of the shields so that the voltages between the shields and the surroundings of the shields successively diminish along the valve stack in a direction away from the second connection towards the first connection, and wherein the semiconductor valve means has a second set of shields, said second set of shields having a plurality of electrostatic shields, distributed along the bushing between the second connection and the enclosure, and surround the bushing.

2. A valve means according to claim 1, wherein the first potential-controlling member comprises a voltage divider connected in parallel with the valve stack and having terminals electrically connected to the shields.

3. A valve means according to claim 2, wherein the voltage divider is composed of resistive and capacitive elements.

4. A valve means according to claim 1, wherein the first potential-controlling member comprises the valve stack, which is provided with terminals electrically connected to the shields.

5. A valve means according to claim 1, wherein the first potential-controlling member is adapted to impart to at least certain shields in the first set of shields potentials which are closer to the potential of the first connection than the potentials of those parts of the valve stack located in the same plane as the respective shield.

6. A valve means according to claim 1, wherein the bushing has a longitudinal axis substantially parallel to the longitudinal axis of the valve stack, wherein each shield in the second set of shields is arranged in a plane substantially perpendicular to the longitudinal axes of the bushing and the valve stack, and the curved parts of each shield have a substantially constant radius of curvature.

7. A valve means according to claim 6, wherein the shields in the second set of shields are substantially identical with the shields in the first set of shields.

8. A valve means according to claim 1, wherein the shields in the second set of shields are electrically connected to a second potential-controlling member adapted to control the potentials of these shields so that the voltage between the shields and the enclosure successively diminishes along the bushing in a direction away from the second connection towards the enclosure.

9. A valve means according to claim 1, wherein a valve arrester is arranged parallel to the bushing between the second connection and the enclosure, and whereby the shields in the second set of shields are adapted to surround both the bushing and the arrester.

10. A valve means according to claim 9, wherein a second potential-controlling member comprises the surge arrester, which has terminals electrically connected to the shields in the second set of shields.

11. A valve means according to claim 8, wherein the second potential-controlling member comprises a separate voltage divider.

12. A valve means according to claim 8, wherein the second potential-controlling member is adapted to impart to at least certain shields in the second set of shields potentials which are closer to the potential of the enclosure than to the potential of those parts of the valve means which are surrounded by the respective shield and located at the same plane as the shield.

13. A valve means according to claim 1, wherein at least certain of the shields are divisible to facilitate the mounting and dismantling of the shields.

14. A valve means according to claim 13, wherein each divisible shield comprises two parts, whereby each part is formed substantially as a circular arc with a constant radius.

15. A valve means according to claim 14, wherein the parts of a divisible shield, where the two shield parts adjoin each other, are retracted in a direction towards the valve.

16. A valve means according to claim 14, wherein each of the two parts of a shield is substantially formed as a circular arc with a center angle which is larger than 180 °.

17. A valve means according to claim 1 wherein at least certain shields are arranged with external envelope surfaces which are inclined in relation to the longitudinal axis of the valve stack so that the distance between the envelope surface and the valve stack diminishes with an increasing distance from the second connection.

* * * * *